(12) United States Patent
Tower et al.

(10) Patent No.: US 7,948,536 B2
(45) Date of Patent: May 24, 2011

(54) GAIN MATCHING FOR ELECTRON MULTIPLICATION IMAGER

(75) Inventors: John Robertson Tower, Princeton, NJ (US); Peter Alan Levine, Princeton, NJ (US)

(73) Assignee: SRI International, Menlo Park, CA (US)

( * ) Notice: Subject to any disclaimer, the term of this patent is extended or adjusted under 35 U.S.C. 154(b) by 554 days.

(21) Appl. No.: 12/128,890

(22) Filed: May 29, 2008

(65) Prior Publication Data

US 2009/0295952 A1 Dec. 3, 2009

(51) Int. Cl.
*H04N 3/14* (2006.01)
*H04N 5/235* (2006.01)

(52) U.S. Cl. ............ 348/294; 348/229.1; 348/222.1; 348/187; 348/188; 250/207

(58) Field of Classification Search ................ None
See application file for complete search history.

(56) References Cited

U.S. PATENT DOCUMENTS

| | | | |
|---|---|---|---|
| 5,225,696 A | 7/1993 | Bahraman | |
| 5,337,340 A | 8/1994 | Hynecek | |
| 6,654,215 B2 * | 11/2003 | Green | ............. 361/56 |
| 7,102,673 B2 | 9/2006 | Kimura | |
| 2005/0012825 A1 | 1/2005 | Kimber | |
| 2008/0043124 A1 | 2/2008 | Subbotin | |
| 2008/0170138 A1 * | 7/2008 | Shibasaki | ............. 348/241 |
| 2008/0230680 A1 * | 9/2008 | Yatokoro | ............. 250/207 |
| 2009/0086055 A1 * | 4/2009 | Tower et al. | ............. 348/229.1 |

OTHER PUBLICATIONS

Stephanie A. Gagar, "Avalanche Gain In Charge Coupled Devices," submitted to the Massachusetts Institute of Technology (Aug. 1986).

* cited by examiner

*Primary Examiner* — David L Ometz
*Assistant Examiner* — Angel L Garces-Rivera
(74) *Attorney, Agent, or Firm* — Lowenstein Sandler PC (57) ABSTRACT

A method and apparatus for equalizing gain in an array of electron multiplication (EM) pixels is disclosed, each pixel having one or more impact ionization gain stages with implants to achieve charge transfer directionality and comprising a phase 1 clocked gate, an EM clocked gate, and two DC gates formed between the phase 1 clocked gate and the EM clocked gate, comprising the steps of (a) applying initial voltages to each of the DC gates and the EM clocked gates of at least two pixels of a plurality of pixels; (b) clocking phase 1 clock gates and an EM clock gates associated with the at least two pixels of the plurality of pixels a predetermined number of times to achieve an average pixel intensity value after impact ionization gain; and (c) selectively adjusting the difference in voltage between the DC gate and corresponding EM clocked gate of the at least two pixels of the plurality of pixels until the difference between the resulting pixel intensity values and the average pixel intensity value needed to produce a desired uniform gain image is below a predetermined threshold.

24 Claims, 11 Drawing Sheets

GAIN MATCHING FOR ELECTRON MULTIPLICATION IMAGER

FIELD OF THE INVENTION

The present invention relates generally to imaging systems, and more particularly to equalization of gain in the output of an array of imaging pixels which employ electron multiplication (impact ionization).

BACKGROUND OF THE INVENTION

A ubiquitous image sensor technology used in digital cameras is the charge-coupled device (CCD) imager. In a typical CCD imager, signal charge representative of incident radiation is accumulated in an array of pixels in an image area. Following an integration period, the signal charge is transferred to an output register by applying appropriate clocking or drive pulses to control electrodes. The signal charge is then read out from the output register and applied to a charge detection circuit to produce a voltage, which is representative of the amount of signal charge.

Figure 1A:
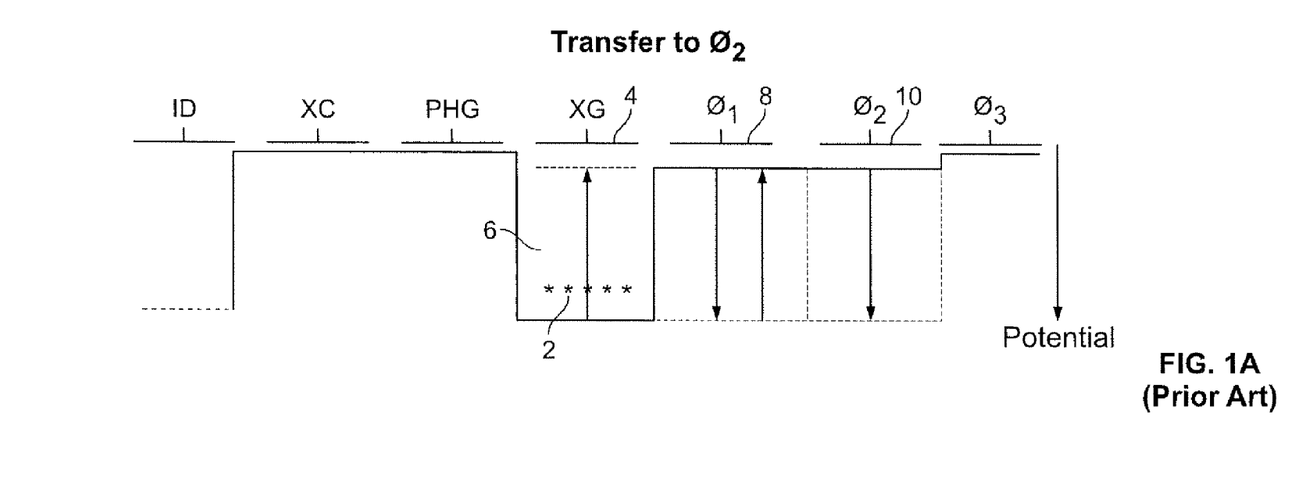
FIGS. 1A and 1B depicts schematic cross-section of CCD gates and accompanying applied potential diagrams which illustrate the principle of impact ionization resulting in electron multiplication as outlined in the Gager paper of the prior art.
Figure 1B:
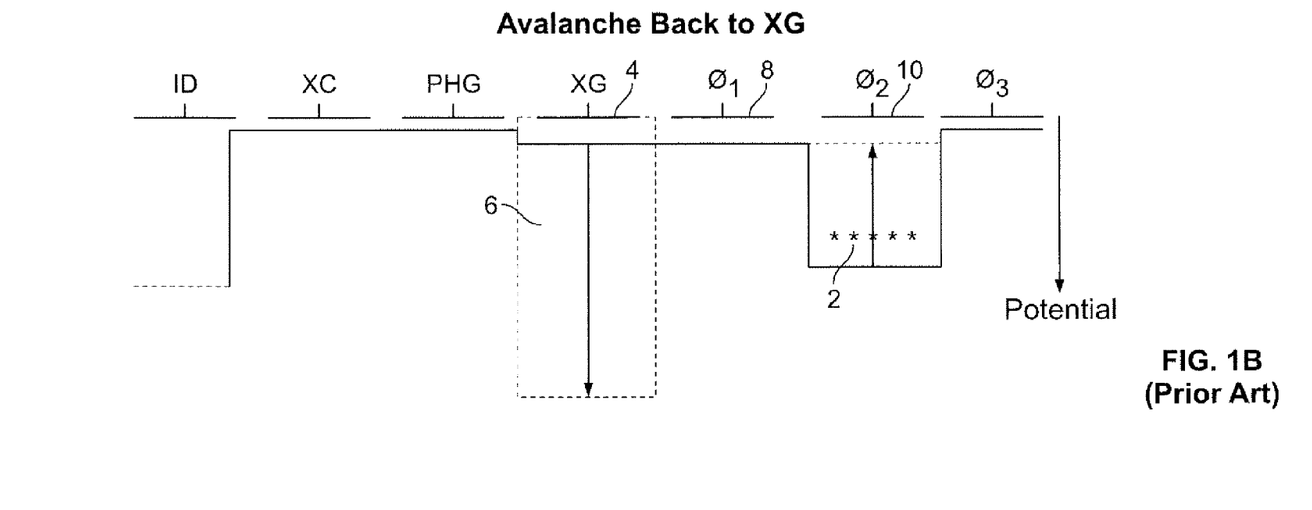

It has been found that, with the application of proper gate potentials, a form of gain via impact ionization can be achieved in a CCD device. In a thesis entitled "Avalanche Gain In Charge Coupled Devices," submitted to the Massachusetts Institute of Technology in August of 1986, Stephanie A. Gagar (hereinafter "Gager") suggested the incorporation of an impact ionization multiplication of charge in a charge coupled device. Referring now to FIG. 1A, charge 2 is collected and accumulated under a gate 4 in a potential well 6. The accumulated charge 2 is then transferred through an intermediate gate 8 to a storage gate 10 where it is temporarily stored. The original gate 4 wherein the charge was first accumulated is then biased into impact ionization. Referring now to FIG. 1B, charge is then transferred back from the temporary holding gate 10 to the accumulating gate 4 which is now biased as an impact ionization gate. This is accomplished by pulsing the holding gate 10 to a lower potential and transferring the charge through the intermediate gate 8 to the impact ionization region. For further gain, this procedure is repeated multiple times, i.e. 100 to 500 times, to build up charge. The gain per impact ionization transfer is roughly 1.015×. The gain after N impact ionization transfers is roughly $(1.015)^N$. For N equal to 400, the resulting gain is about 386. Once sufficient charge has been built up, the charge is moved off of the CCD gates to a charge sensitive amplifier for charge-to-voltage conversion and read out.

Figure 2A:
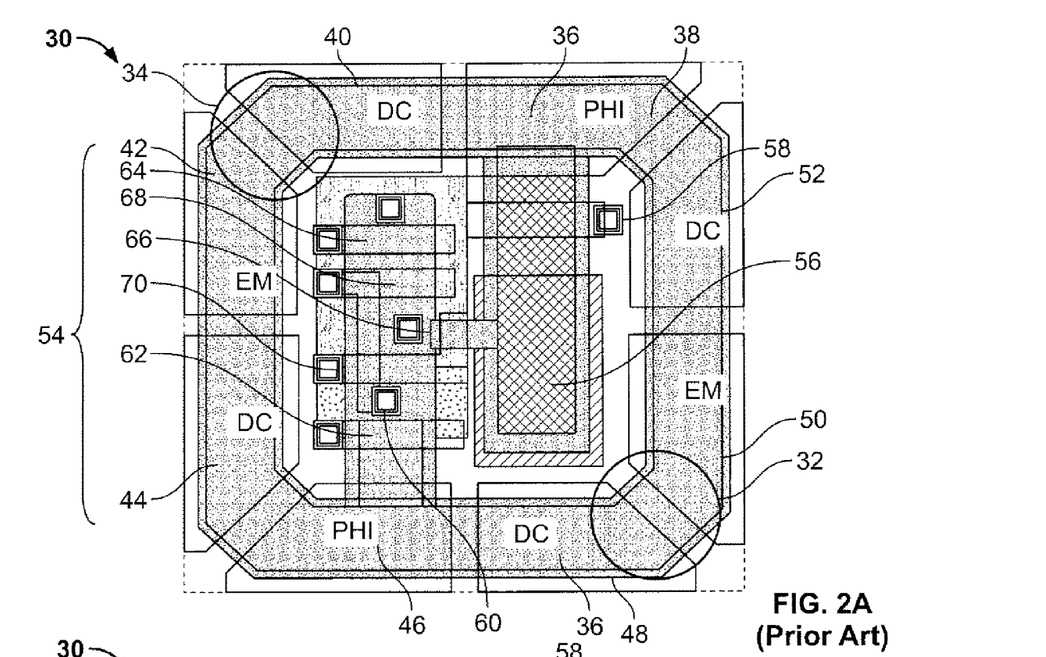
FIGS. 2A and 2B are plan views of a Tower et al. EMCMOS pixel layout and architecture of the prior art.
Figure 2B:
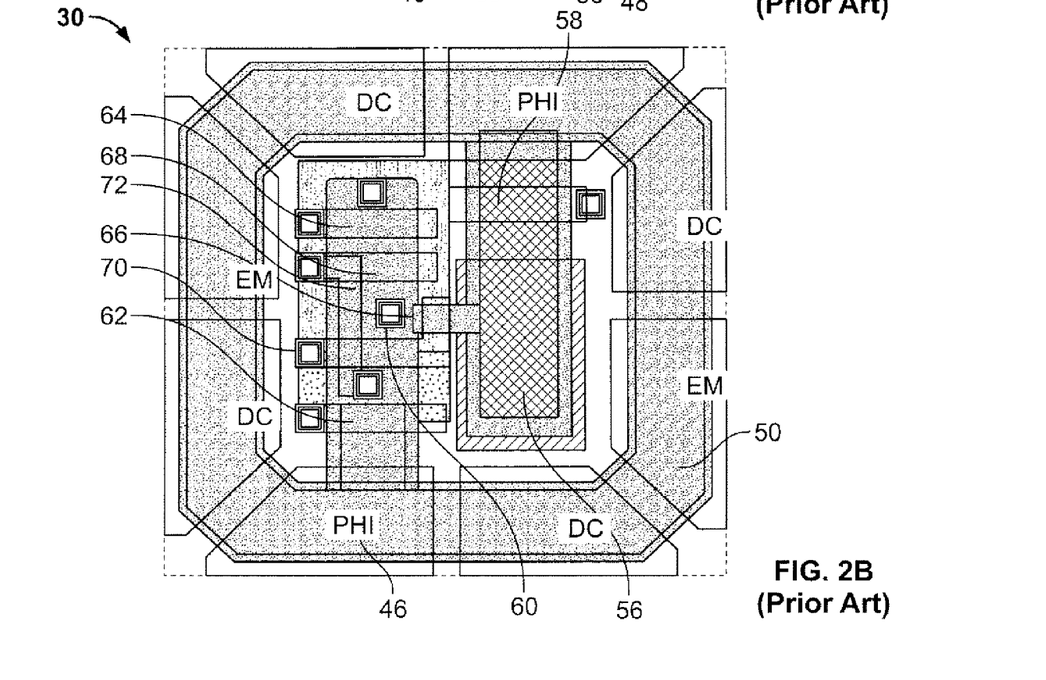

A second design employing impact ionization can be found in pending commonly owned U.S. application Ser. No. 11/863,945 filed Sep. 28, 2007 to John Robertson Tower et al. (hereinafter "Tower et al."), which is incorporated herein by reference in its entirety. Referring now to FIGS. 2A and 2B, plan views of the Tower et al. EMCMOS device layout and architecture are depicted. Charge collection, storage, and electron multiplication (EM) regions are incorporated into a single pixel 30 formed monolithically as an integrated circuit. The pixel 30 includes electron multiplication (EM) gain regions 32, 34 whose accumulated charge circulates around an enclosed track or circulating register called the EM gain register 36. In FIGS. 2A, 2B, there are a total of eight gates which constitute two stages of the EM gain register 36: PHI (clocked gate) 38, DC gate 40, EM (high voltage clocked gate) 42, DC gate 44, PHI 46, DC gate 48, EM 50, and DC Gate 52. In the more general case, the Tower et al. device can comprise one or more impact ionization gain stages with implants to achieve charge transfer directionality.

A readout structure 54 comprising a number of sub-structures are fabricated in the pixel 30 nested within the EM gain register 36. The light sensitive area, which creates electrons in proportion to the radiant energy incident on the pixel 30 can be an optical-to-charge conversion device such as a pinned photodiode (PPD) 56 as shown, a photogate, etc. The PPD 56 is connected to and releases the accumulated charge to the EM gain register 36 by means of a PPD transfer gate (TR1) 58. A floating diffusion sense node 60 for receiving amplified charge from the EM gain register 36 and for converting the charge to a voltage is also connected to the EM gain register 36 by means of a floating diffusion transfer gate (TR2) 62. The readout circuitry 54 includes a row select gate 64, a PPD reset gate 66, a source follower transistor 68, and a source follower reset gate 70. Power is supplied to the pixel 30 by means of power rail VDD 72. The pixels 30 can be manufactured using a CMOS process, preferably a PPD CMOS process.

Figure 3A:
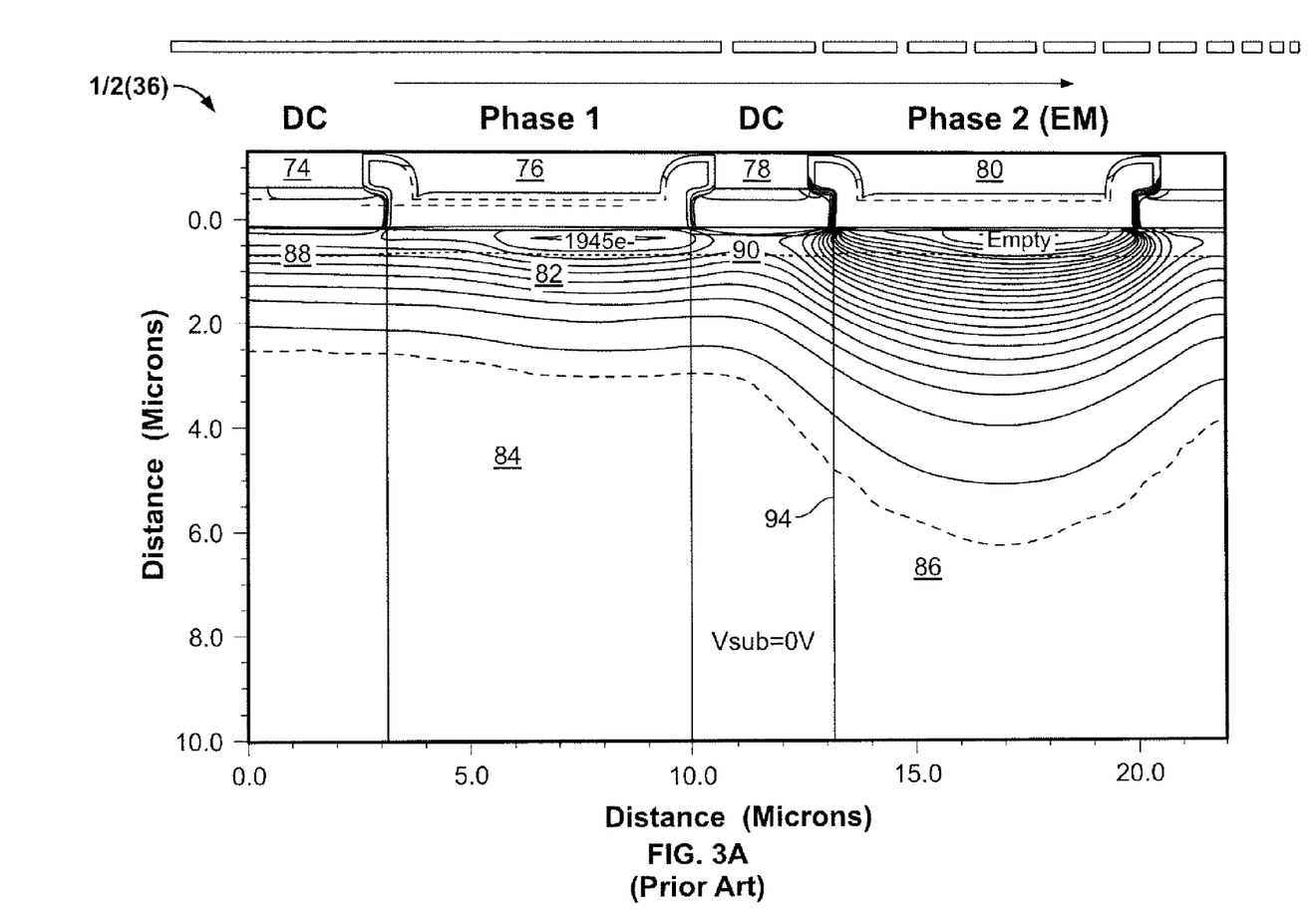
FIGS. 3A-3C depict a schematic cross-section of the electron multiplication gates and accompanying applied potential diagrams of the pixel of FIGS. 2A and 2B.
Figure 3B:
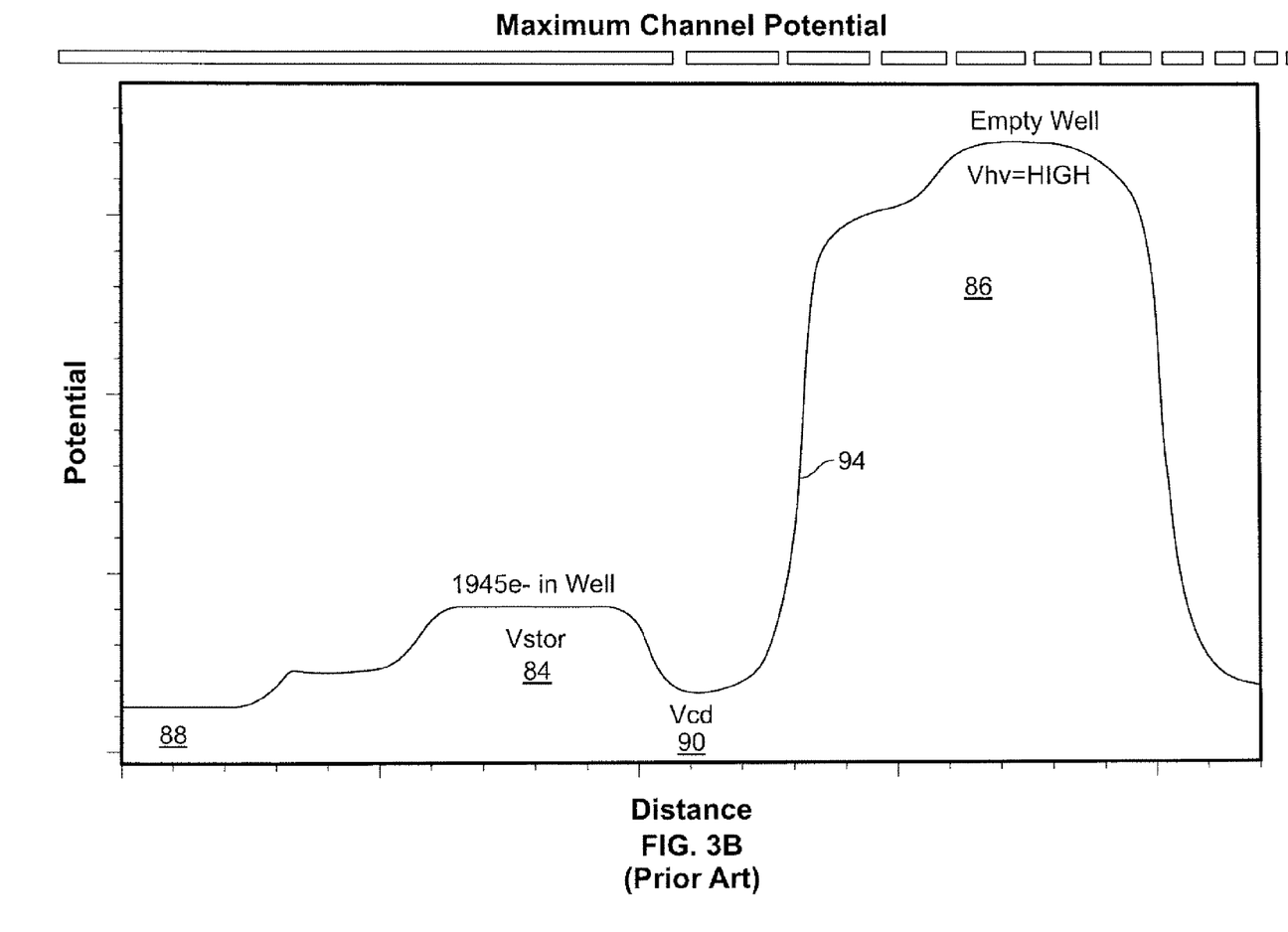
Figure 3C:
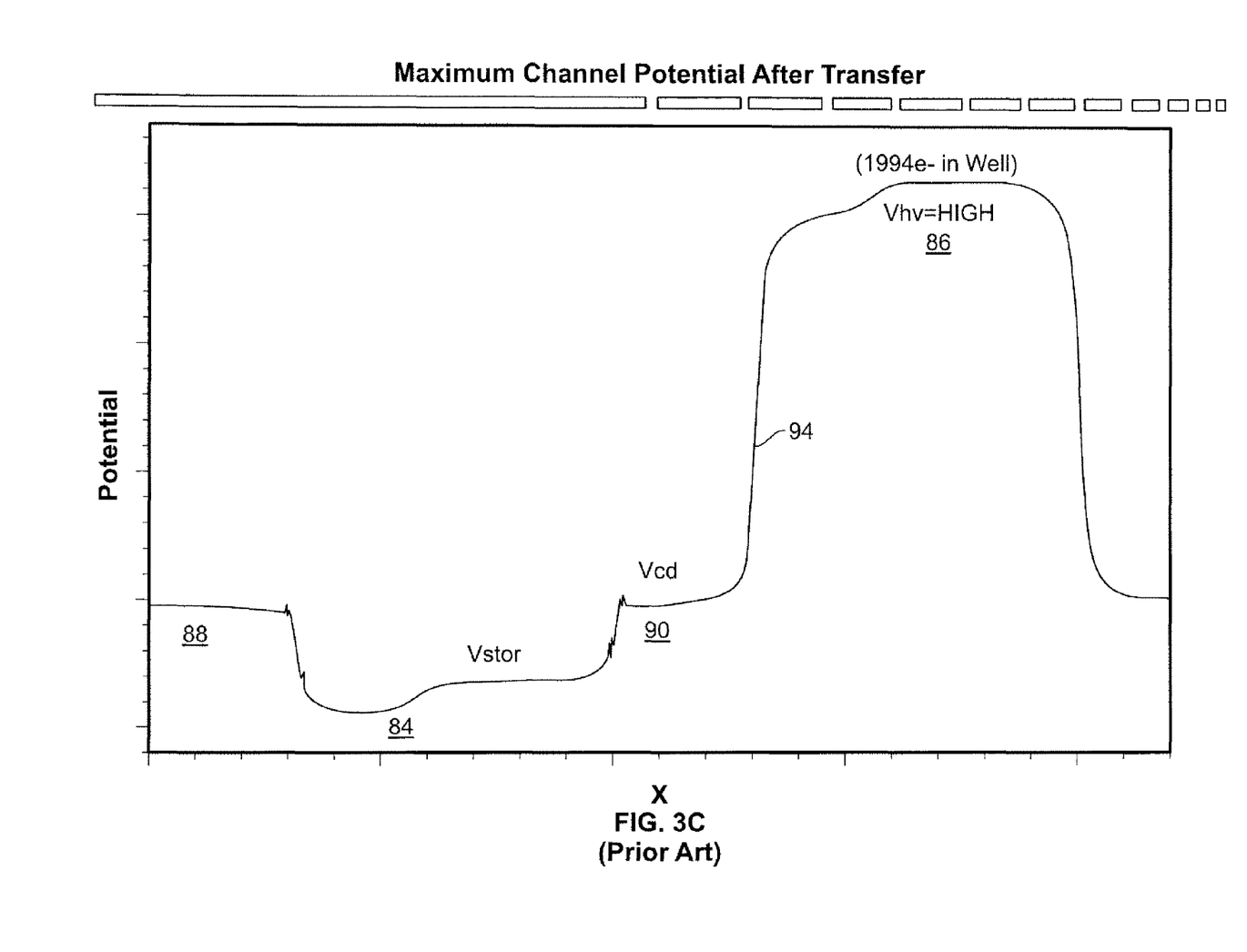
Figure 4A:
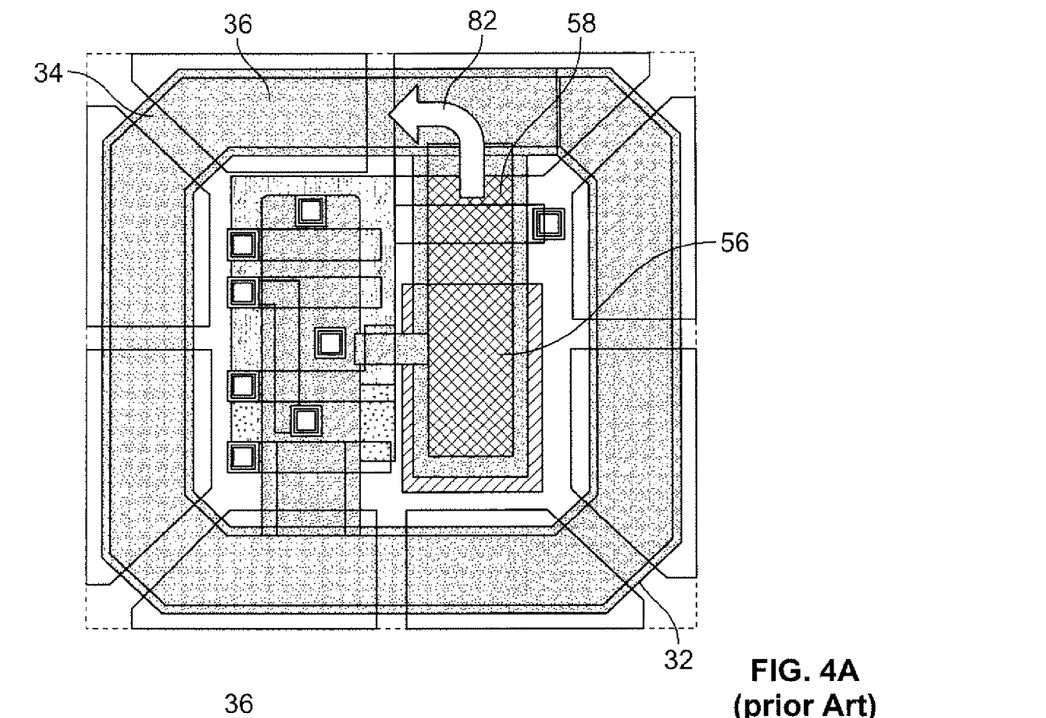
FIGS. 4A-4D illustrate the operation of the pixel of FIGS. 2A and 2B.
Figure 4B:
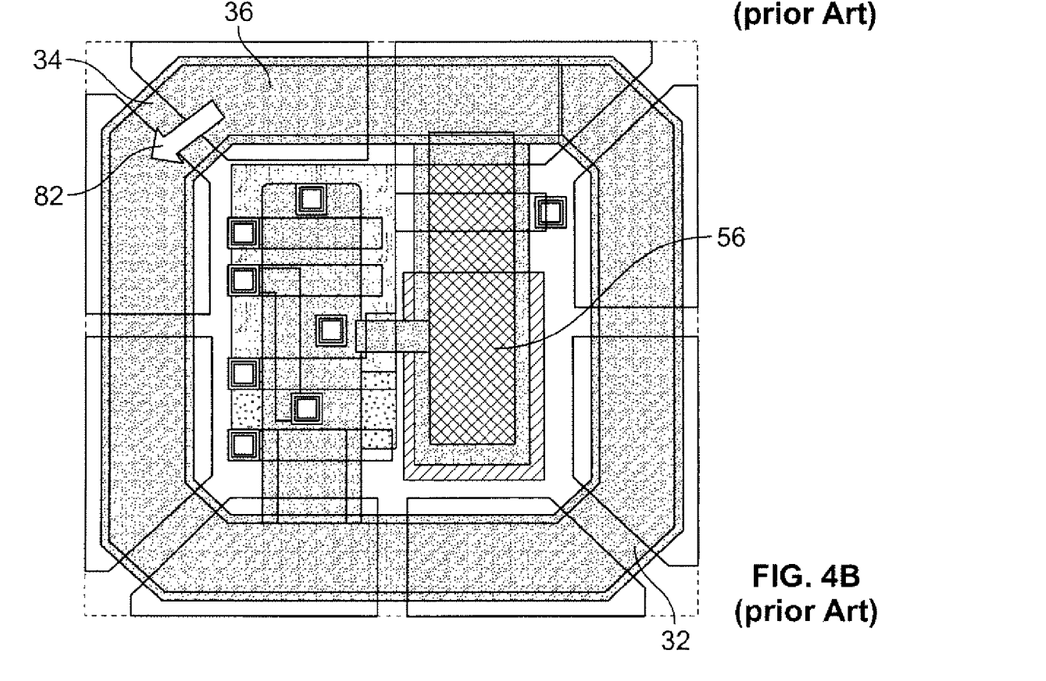

Referring now to FIGS. 3A-3C, a schematic cross-section of one stage (4 gates) of the (EM) gain register 36 and accompanying applied potential diagrams of the pixel 30 is depicted. Each EM gain stage includes four gates: a first DC gate 74, a phase 1 clock gate 76, a second DC gate 78, and a phase 2 clock gate 80 which is employed to control the electron multiplication function. The clocking of the EM gain register 36 is done with two clock phases, as shown in FIG. 4A. During a first clock period shown in FIG. 3B, the phase 1 clock gate 76 has a first potential applied to it to hold the accumulate charge (electrons) in a charge packet 82 in a potential well 84 below the phase 1 clock gate 76. Meanwhile, a larger potential is applied to the phase 2 clock gate 80 to create a potential well 86, which is initially devoid of charge. Barrier regions 88, 90 are created below the DC gates 74, 78, respectively, to assure proper direction of charge transfer between the clock gates 76, 80 and between the (EM) gain regions 32, 34 by the application of appropriate low DC voltage levels relative to the high voltages applied to the clock gates 76, 80 when they are in their high (on) state. During a second clock cycle shown in FIG. 3C, the potential of the phase 1 clock gate 76 is changed to about 0 volts which is lower than the potential applied to the DC gates 74, 78. Electrons that have accumulated below the phase 1 gate clock 76 now "spill" over into the well 86 and can undergo impact ionization at the interface 94 between the second DC gate 78 and the phase 2 clock gate 80. As a result, the electron charge packet 82 transfers to the well 86. Proper directionality is achieved by optimized implants.

The electrons in a charge packet 82 are made to circulate a predetermined number of times through the EM gain regions 32, 34 in the pixel 30. Although the probability of impact ionization, and thus the mean gain per stage g for each of the EM gain regions 32, 34 is low, the number of times that the charge packet 82 pass around the EM gain registers 36 and through EM gain regions 32, 34 in the pixel 30, designated as N, can be high. The total gain of the cascaded multiplication elements (EM gain regions 32, 34) is given by $M=g^N$. For N=600 and g=1.015 (1.5 percent probability of impact ionization), the total gain in the charge domain is over 7500×.

FIGS. 4A-4D illustrate the operation of the pixel 30 of FIGS. 2A and 2B. In a first time period (FIG. 4A), a charge packet 82 accumulated in the pinned photodiode (PPD) 56 is loaded into the EM gain register 36 via the PPD transfer gate 58 (TR1). In a second time period (FIG. 4B), the charge packet 82 circulates around the EM gain register 36 through the EM gain regions 32, 34. As a result, the charge packet 82 circulating around EM gain register 36 accumulates nominally about 400 transfers through the EM gain regions 32, 34

Figure 4C:
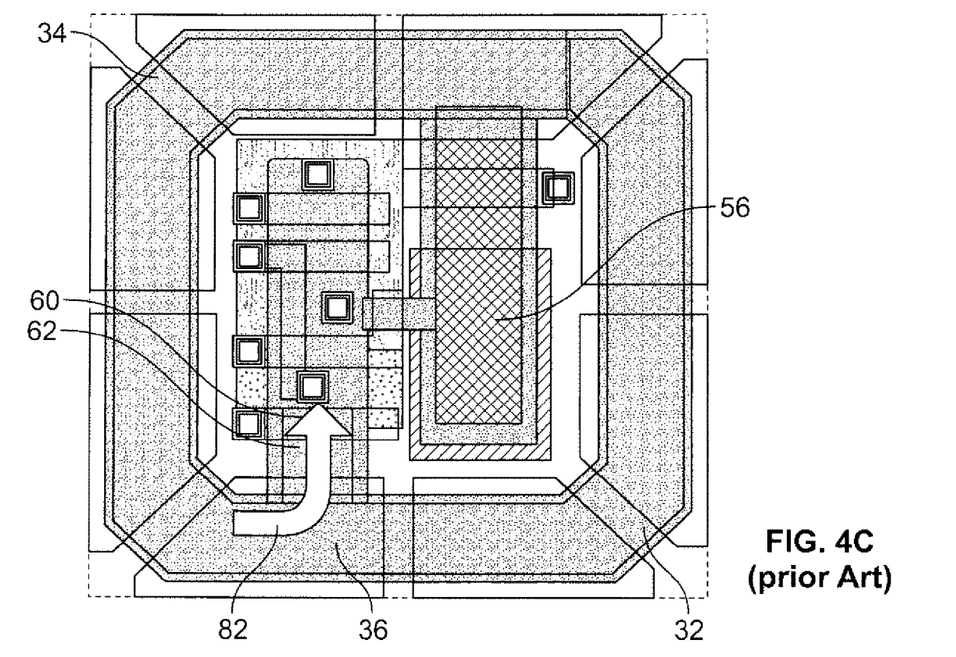
Figure 4D:
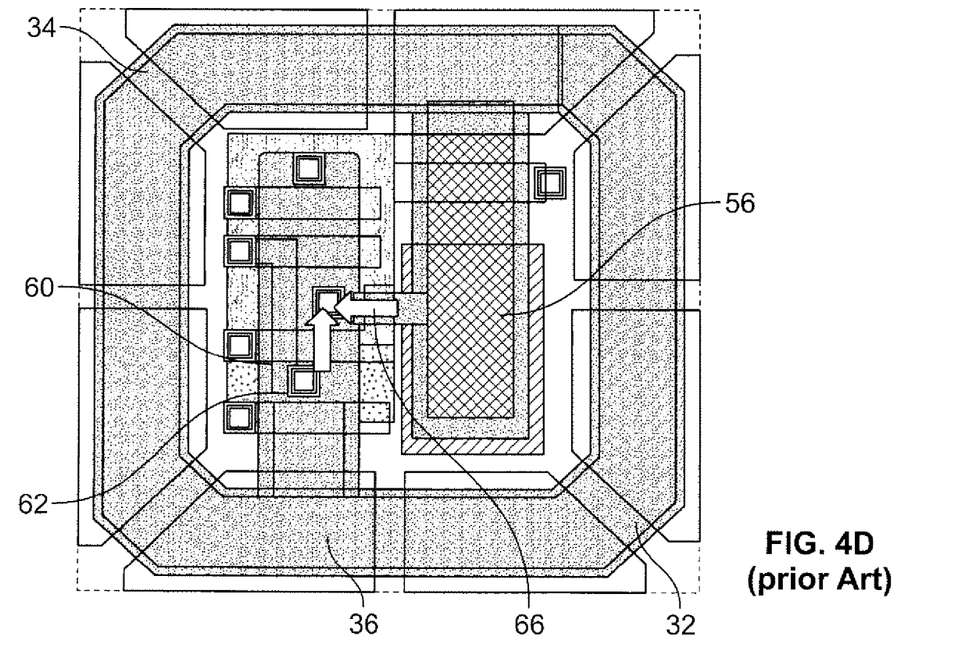

(200 cycles). In a third time period (FIG. 4C), the amplified charge packet 82 is transferred to the floating diffusion sense node 60 by means of the floating diffusion transfer gate 62 where the charge packet is converted to a voltage, the floating diffusion sense node 60 acting like a capacitor. In a fourth time period (FIG. 4D), the floating diffusion sense node 60 and the PPD 56 are reset (global reset) via the PPD reset gate 66. Then the sequence is repeated for the next frame.

For both the "linear" architecture of the Gager device and the "circular" architecture of the Tower et al. device, as well as other CCD or CMOS pixels employing impact ionization in the prior art, if the pixels are arranged in a two dimensional array, a problem arises in that, since each pixel has slightly different design and process tolerances, the electron multiplication gain may differ from pixel to pixel. Although slight differences of device parameters may have little effect on the signal charge and output voltage for a single pass through EM gain regions, differences in gain are magnified as a result of charge circulating through the EM gain regions hundreds of times.

Accordingly, what would be desirable, but has not yet been provided, is a means of equalizing gain among solid state EM gain pixels arranged in arrays.

SUMMARY OF THE INVENTION

The above-described problems are addressed and a technical solution is achieved in the art by providing a method and apparatus for equalizing gain in an array of electron multiplication (EM) pixels. Each pixel comprises one or more impact ionization gain stages with implants to achieve charge transfer directionality. The invention is built upon the fact that the gain in the pixel architecture chosen is determined by the voltage difference between the DC gate and the high level of the EM clocked gate. A means is provided that permits the DC gate level to be adjusted individually when the selected row of pixels is being clocked to produce impact ionization gain.

In the solution chosen, each pixel EM gain stage comprising a phase 1 clocked gate, an EM clocked gate, and DC gates formed between the phase 1 clocked gates and the EM clocked gates, comprising the steps (a) applying initial voltages to each of the DC gates and the EM clocked gates of at least two pixels of a plurality of pixels; (b) clocking phase 1 clock gates and an EM clock gates associated with the at least two pixels of the plurality of pixels a predetermined number of times to achieve pixel intensity values after impact ionization gain; and (c) selectively adjusting the difference in voltage between the DC gate and corresponding EM clocked gate of the at least two pixels of the plurality of pixels until the difference between the resulting pixel intensity values and the average pixel intensity value needed to produce a desired image is below a predetermined threshold. The method can further comprise the step of, before step (b), exposing the plurality of pixels to light reflected from a flat field; wherein step (c) further comprises the steps of: (d) selectively adjusting voltages applied to the DC gates associated with the at least two pixels of the plurality of pixels such that substantially all of the pixels are projected to have the same gain; and (e) repeating steps (b) and (c) until the difference between the resulting pixel intensity values and the average pixel intensity value needed to produce a desired flat field image is below a predetermined threshold.

The array of EM pixels can be arranged in a 2-dimensions array of rows and columns, each row including a common phase 1 clock gate bus and a common EM clock gate bus, each column including a common DC gate bus, and wherein step (c) further comprises the steps of (f) selecting a row of pixels; (g) applying a first set of DC voltages to the DC gate buses; (h) clocking a phase 1 clock gate bus and an EM clock gate bus associated with the row of pixels; and (i) holding the phase 1 clock gate buses and EM clock gate buses of the other rows of pixels at predetermined constant DC voltages so as to be inactive. Step (c) can further comprise the steps of (j) selecting another row of pixels; (k) applying a second set of DC voltages to each of the DC gate buses; (l) clocking a phase 1 clock gate bus and an EM clock gate bus associated with the another the row of pixels; (m) holding the phase 1 clock gate buses and EM clock gate buses of the other rows of pixels at predetermined constant DC voltages so as to be inactive; and (n) repeating steps (j)-(m) until substantially all rows in the plurality of pixels have achieved the same pixel intensity value after EM gain.

Each row can be associated with a row selection bus, wherein step (d) further comprises the steps of (o) selecting a row of pixels via the row selection bus; (p) reading a set of output voltage values of each of the columns; (q) storing the set of output voltage values in a memory; (r) selecting an additional row of pixels; (s) repeating steps (o)-(r) until substantially all of the rows in the plurality of pixels have achieved the substantially the same gain.

The method can further comprise the steps of recalling all of the stored voltage values; performing a calculation to determine whether a flat field image has been achieved; calculating a plurality of DC voltages to be applied to corresponding ones of the DC gates in the array of pixels to achieve substantially the same gain; and storing values corresponding to the plurality of DC voltages in the memory.

BRIEF DESCRIPTION OF THE DRAWINGS

The present invention will be more readily understood from the detailed description of exemplary embodiments presented below considered in conjunction with the attached drawings, where like structures have like reference numerals, of which.

It is to be understood that the attached drawings are for purposes of illustrating the concepts of the invention and may not be to scale.

DETAILED DESCRIPTION OF THE INVENTION

Referring again to FIGS. 3A and 3C, the gain of an EM gain stage 36 of a pixel 30 for the Tower et al. device is proportional to the electric field associated with the potential well 86. The impact ionization gain is set by the difference between the voltage applied to the phase 2 (EM) clock gate 80 and the voltage applied to the DC gate 78. Thus, to match the gains across an array of pixels, the voltage differences between corresponding phase 2 (EM) clock gates 80 and DC gates 78 can be trimmed. While the voltage differences can be adjusted by trimming either or both of the voltages applied to the phase 2 (EM) clock gates 80 and DC gates 78, for practical reasons (such as clock settling and clock stability) it is easier to implement trimming of the voltages applied to the DC gates 78. While the voltages applied to the column DC gates 78 are adjustable (typically ±100 mV), the voltages applied to the phase 1 clock gate 76 (typically about 4V-10V amplitude) and the phase 2 (EM) clock gates 80 (typically about 12V-23V amplitude) are common for all pixels actively being clocked.

Figure 5:
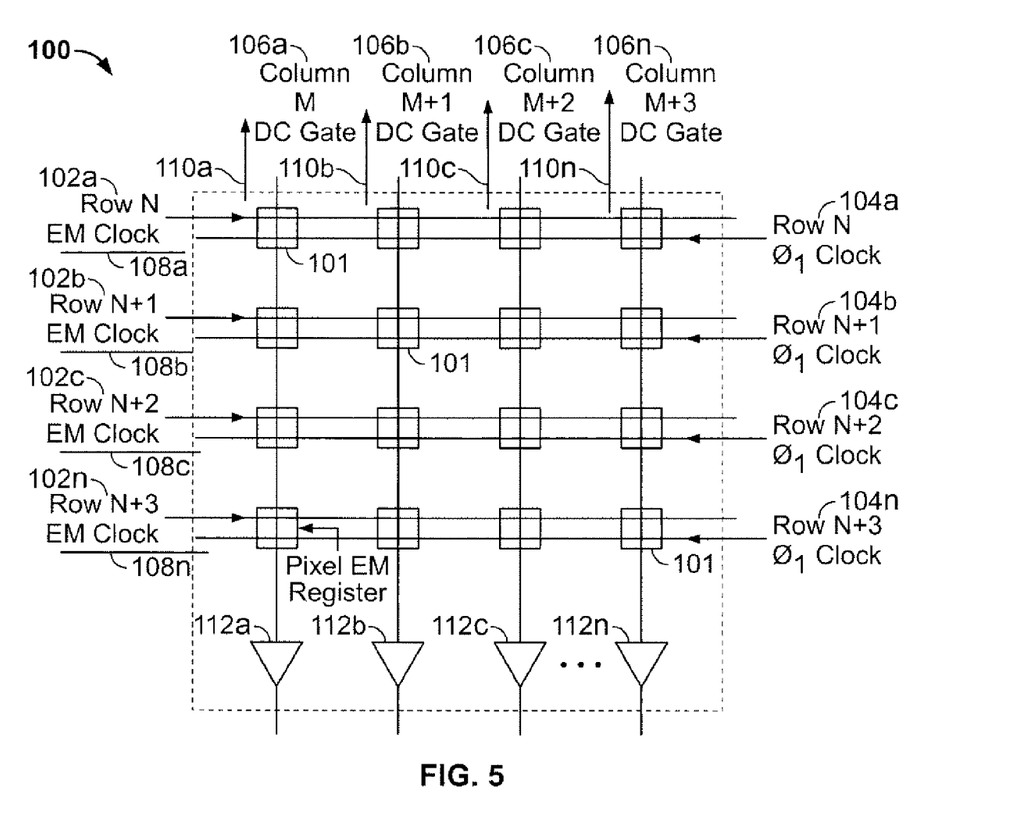
FIG. 5 is a block diagram of an arrangement of a two-dimensional array of electron multiplication (EM) pixels employing a calibration procedure according to an embodiment of the present invention.

FIG. 5 shows an arrangement of a two-dimensional array 100 of electron multiplication (EM) pixels 101 employing a calibration procedure according to an embodiment of the present invention. An EM pixel 101 is located at each of the intersections of a plurality of horizontal EM clock bus lines 102a-102n, phase 1 clock bus lines 104a-104n, and vertical DC gate bus lines 106a-106n. Each row of the pixels 101 can have a common EM clock bus line, e.g., 102a, (labeled N, N+1, N+2, etc.) and phase 1 clock bus, e.g., 104a, (labeled N, N+1, N+2, etc.). Each column of pixels 101 can have a common DC gate bus line, e.g., 104a, (labeled M, M+1, M+2, etc.). Each of the column DC gate bus lines 104a-104n can be independently controlled. If only one row (e.g., N) is clocked at one time, each of the pixels 101 in that row can have its gain adjusted pixel by pixel, by individual adjustment of the separate column DC gate bus lines 104a-104n. To read the output voltage produced by the array 100 of pixels 101, the pixels 101 are provided with horizontal row selection lines 108a-108n a vertical column bus selection lines 110a-110n, and a plurality of column bus amplifiers 112a-112n.

Figure 6A:
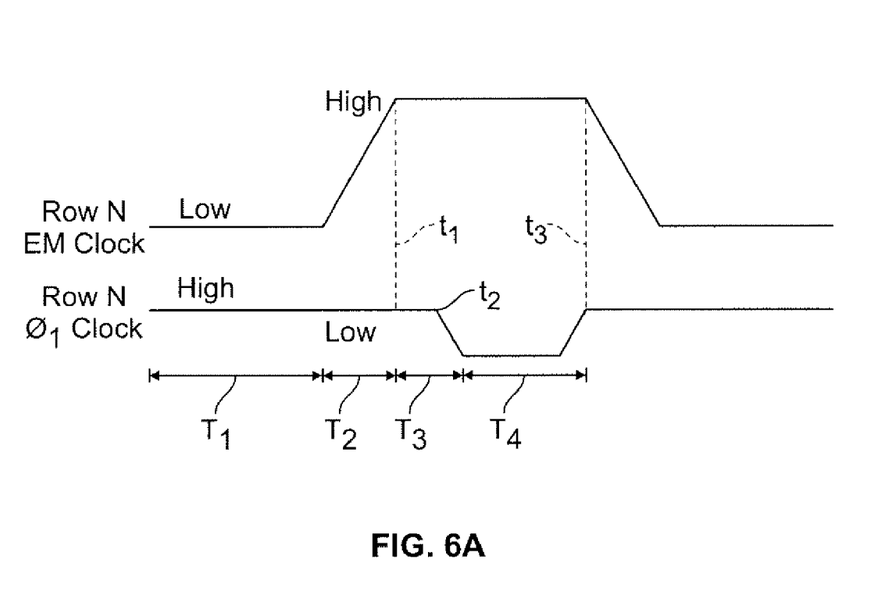
FIGS. 6A and 6B depict a timing diagram showing clocking conditions of the EM clock bus lines and the phase 1 clock bus lines of the imaging array of FIG. 5 during calibration time.
Figure 6B:
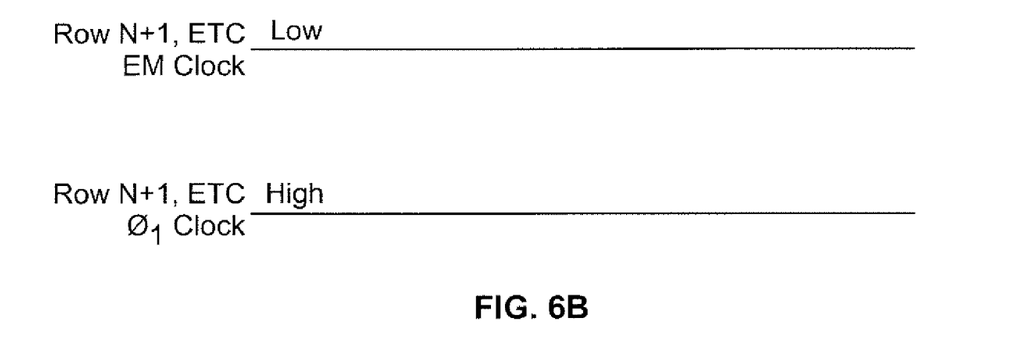

Referring now to FIGS. 5, 6A and 6B, a timing diagram shows clocking conditions of the EM clock bus lines 102a-102n and the phase 1 clock bus lines 104a-104n during calibration time (which can also mirror the relative clocking times during normal operation as shown in FIGS. 3B and 3C). The voltage levels of an inactive row, e.g., row N+1, are held at constant DC levels such that no gain occurs in the pixels of that row. The EM clock bus line 102b for row N+1 is held "low," while the phase 1 clock bus line 102b for row N+1 is held "high." For an active row, e.g., row N, during initial time interval $T_1$ the EM clock bus line 102a is also held "low," while the phase 1 clock bus line 104a for row N is held "high." During time interval $T_2$, the EM clock bus line 102a input is set to high, but because of capacitance a finite time is needed before the EM clock bus line voltage settles at about time $t_1$. During the time interval $T_3$, both the phase 1 clock bus line 104a is still held at a "high" level in order to allow for the voltage across the EM clock bus line 102a to settle. Then at time $t_2$, the phase 1 clock bus line 104a is set to "low," which allows charge that has accumulated under a phase 1 gate to "spill" over into a charge well formed by the application of the high EM clock gate voltage during time interval $T_4$ and thereby acquiring gain through impact ionization. At time $t_3$, the phase 1 clock gate voltage is set back to high, but needs a finite amount of time to settle. Once the phase 1 clock voltage has settled at time $t_4$, the EM clock bus line 102a is set back to "low", but takes a finite time to settle.

Figure 7:
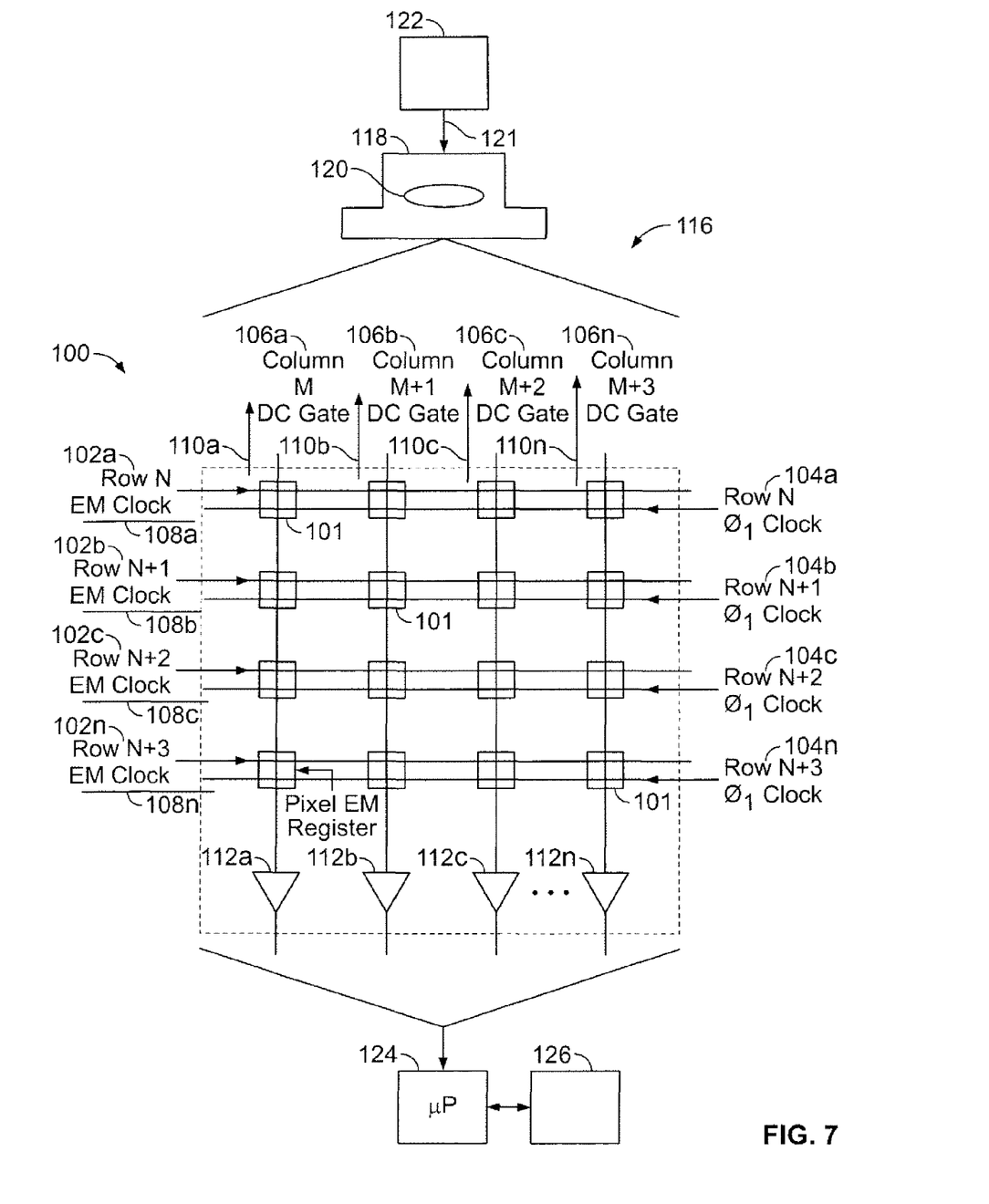
FIG. 7 is a block diagram of the two dimensional array of EM pixels of FIG. 5 incorporated into a calibration fixture.

Referring now to FIG. 7 a block diagram of the two dimensional array 100 of EM pixels 101 incorporated into a calibration fixture 116 is depicted. The calibration fixture includes a camera 118 with focusing optics 120, at least one a processor 124, and a memory 126. The imaging array 100 and the calibration fixture 116 can be incorporated entirely into a functioning camera or can be incorporated into stand-alone factory test equipment.

Figure 8:
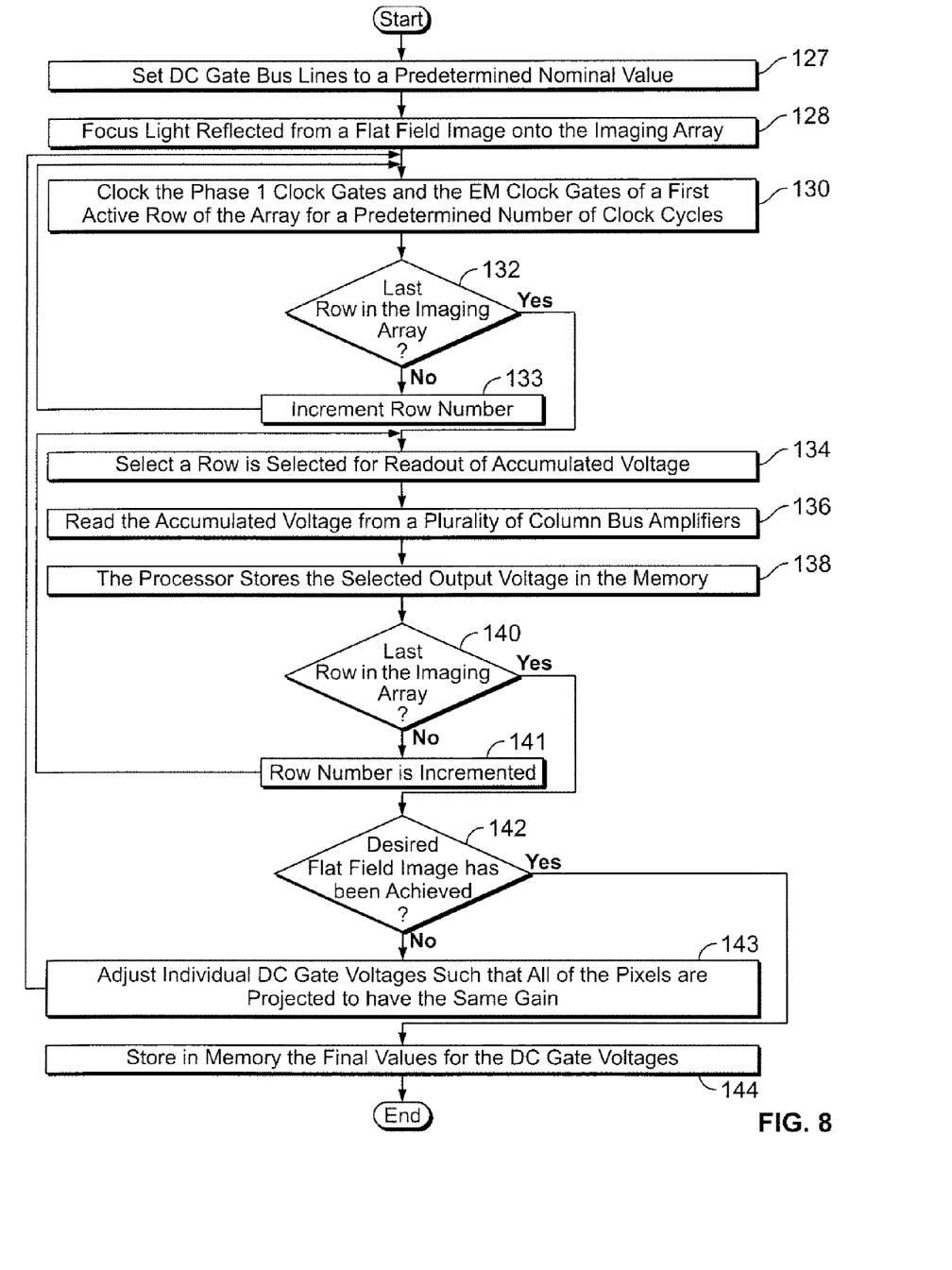
FIG. 8 is a flow chart illustrating steps of the calibration procedure of the present invention.

Referring now to FIGS. 5 and 7 and the flow chart of FIG. 8, in operation, at step 127, the vertical DC gate bus lines 106a-106n are set to a predetermined nominal DC voltage stored in the memory 126 for all of the pixels 101. At step 128, light 121 reflected from a flat field image 122 is focused by the focusing optics 120 of the camera 118 onto the imaging array 100. At step 130, a first active row is clocked for a predetermined number of clock cycles (to achieve a desired average pixel intensity value) with the waveforms discussed in FIG. 6 with respect to one of the EM clock bus lines 102a-102n and one of the phase 1 clock bus lines 104a-104n, while the others of the EM clock bus lines 102a-102n and the phase 1 clock bus lines 104a-104n are held at their predetermined constant values. At step 132, if this is not the last row in the imaging array 100, then at step 133, the row number is incremented and step 130 is repeated fort the next row in the imaging array 100. If, at step 132, the last row of the imaging array has been clocked, then at step 134, a row is selected for readout of accumulated voltages. At step 136, each of the vertical column bus selection lines 110a-110n is selected, either one at a time or all at once, such that the accumulated voltage is read out by the plurality of column bus amplifiers 112a-112n. At step 138, the processor 124 stores the selected output voltage in the memory 126. At step 140, if this is not the last row in the imaging array 100, then at step 141, the row number is incremented and step 134-138 are repeated for the next row in the imaging array 100.

If, at step 140, the last row of the imaging array has been clocked, then at step 142, if a desired flat field image has not yet been achieved, then at step 143, the processor 124 recalls all of the stored output voltages and calculates individual DC gate voltage for each of the pixels 101 from the voltage values stored in the memory 126 that would make all of the pixels have the same gain. Steps 130-142 are repeated. If, at step 142, the desired flat field image has been achieved, then at step 144, the final values for the DC voltages to be applied to each of the pixels 101 are stored by the processor 124 in the memory 126.

Note that, although the present invention has been described above in terms of adjusting DC gate voltages, the present invention is not limited to such an arrangement. In the more general case, all that is required is to adjust voltage difference between the DC gate and the high level of the EM clocked gate of an EM gain stage of a given pixel.

Optionally, the DC gate voltages can be applied one row at a time or on an individual pixel basis. In another embodiment, multiple DC values for each pixel could be stored in the memory 126 to compensate for temperature fluctuations. In another embodiment, multiple DC values can be stored in the memory 126 to adjust for different levels of average desired gain. The imaging array 100 can be run in a number of modes including snapshot mode and progressive scan mode. Table 1 details the clock rates that would be needed to implement the present invention for a 1024×1024 pixel array. The table assumes that only one row being clocked at a time with each pixel being clocked for 200 cycles to produce an overall gain of about 20×. With an output source follower noise floor of <10 e RMS, the effective noise floor would be driven to <1 e RMS.

TABLE 1

Example for 1024 × 1024 Imager

| Pixel Format | 1024 × 1024 | |
|---|---|---|
| Frame Rate | 30 | Fps |
| Vertical Blanking | 300 | μs |
| Frame Readout | 33 | ms |
| Row Time | 32 | μs |
| EM Stages per Pixel | 2 | |
| EM Gain per Stage | 1.5% | |
| Total Gain per Frame | 20× | |
| Number of EM Cycles Required | 200 | |
| Addressing/Reading Row Time | 12 | μs |
| EM Row Time Available | 20 | μs |
| EM Clock Rate | 10 | MHz |

It is to be understood that the exemplary embodiments are merely illustrative of the invention and that many variations of the above-described embodiments may be devised by one skilled in the art without departing from the scope of the invention. It is therefore intended that all such variations be included within the scope of the following claims and their equivalents.

What is claimed is:

1. A method for equalizing gain in an array of electron multiplication (EM) pixels, each pixel comprising a phase 1 clocked gate, an EM: clocked gate, and two DC gates formed between the phase 1 clocked gate and the EM clocked gate with directionality implants, comprising the steps of:
   (a) applying initial voltages to each of the DC gates and the EM clocked gates of at least two pixels of a plurality of pixels;
   (b) clocking phase 1 clock gates and an EM clock gates associated with the at least two pixels of the plurality of pixels a predetermined number of times to achieve an average pixel intensity value after impact ionization gain; and
   (c) selectively adjusting the difference in voltage between the DC gate and corresponding EM clocked gate of the at least two pixels of the plurality of pixels until the difference between the resulting pixel intensity values and the average pixel intensity value needed to produce a desired image is below a predetermined threshold.

2. The method of claim 1, further comprising the step of, before step (b), exposing the plurality of pixels to light reflected from a flat field, wherein step (c) further comprises the steps of:
   (d) selectively adjusting voltages applied to the DC gates associated with the at least two pixels of the plurality of pixels such that substantially all of plurality of pixels are projected to have the same gain; and
   (e) repeating steps (b) and (c) until the difference between the resulting pixel intensity values and the average pixel intensity value needed to produce a desired flat field image is below a predetermined threshold.

3. The method of claim 2, wherein the plurality of EM pixels is arranged in a 2-dimensions array of rows and columns, each row including a common phase 1 clock gate bus and a common EM clock gate bus, each column including a common DC gate bus, and wherein step (b) further comprises the steps of:
   (f) selecting a row of pixels;
   (g) applying a first set of DC column voltages to the DC gate buses;
   (h) clocking the phase 1 clock gate bus and the EM clock gate bus associated with the row of pixels; and
   (i) holding the phase 1 clock gate buses and EM clock gate buses of the other rows of pixels at predetermined constant DC voltages so as to be inactive.

4. The method of claim 3, wherein step (h) further comprises the steps of:
   applying a first voltage to the phase 1 clock gate bus of the selected row of pixels, whereby first charge wells form below each of the phase 1 clock gates of the pixels associated with the selected phase 1 clock gate bus;
   applying a second voltage greater than the first voltage to the EM clock gate bus of the selected row of pixels, whereby second charge wells that are deeper than the first charge wells are formed below each of the EM clock gates of the pixels associated with the selected EM clock gate bus, the first set of DC voltages less than the first and second voltages having been applied to the DC gate buses such that charge barriers form between the first charge wells and the second charge wells;
   applying a third voltage that is less than each voltage in the first set of DC voltages to the phase 1 clock gate bus of the selected row of pixels, whereby each of the charge packets undergoes impact ionization as it transfers from a corresponding one of the first charge wells to a corresponding one of the second charge wells associated with each of the plurality of pixels.

5. The method of claim 4, wherein step (b) further comprises the steps of:
   (j) selecting an additional row of pixels;
   (k) applying a second set of DC column voltages to each of the DC gate buses;
   (l) clocking the phase 1 clock gate bus and the EM clock gate bus associated with the another the row of pixels;
   (m) holding the phase 1 clock gate buses and EM clock gate buses of the other rows of pixels at predetermined constant DC voltages so as to be inactive; and
   (n) repeating steps (j)-(m) until substantially all rows in the plurality of pixels have achieved the average pixel intensity value.

6. The method of claim 5, wherein each row is associated with a row selection bus, wherein step (d) further comprises the steps of:
   (o) selecting a row of pixels via the row selection bus;
   (p) reading a set of output voltage values of each of the columns;
   (q) storing the set of output voltage values in a memory;
   (r) selecting another row of pixels;
   (s) repeating steps (o)-(r) until substantially all of the rows in the plurality of pixels have achieved the substantially the same gain.

7. The method of claim 6, further comprising the steps of:
   recalling substantially all of the stored voltage values;
   performing a calculation to determine whether a flat field image has been achieved;
   calculating a plurality of DC voltages to be applied to corresponding ones of the DC gates in the array of pixels to achieve substantially the same gain; and
   storing values corresponding to the plurality of DC voltages in the memory.

8. The method of claim 2, wherein the array of EM pixels is arranged in 2-dimensions array of rows and columns, each row including a common phase 1 clock gate bus and a common EM clock gate bus, each column including a common DC gate bus, and wherein step (b) further comprises the steps of:
- (f) selecting a row of pixels;
- (g) selecting DC gate bus voltages (one per column per selected row);
- (h) applying DC voltages to DC gate column buses;
- (i) clocking the phase 1 clock gate bus and the EM clock gate bus associated with the row of pixels;
- (j) holding the phase 1 clock gate buses and EM clock gate buses of the other rows of pixels at predetermined constant DC voltages so as to be inactive;
- (k) selecting another set of DC gate bus voltages; and
- (l) repeating steps (h)-(k) until substantially all of the pixels in the plurality of pixels have achieved the average pixel intensity value.

9. The method of claim 8, wherein each row is associated with a row selection bus, wherein each column is associated with a column selection bus, and step (d) further comprises the steps of:
- (m) selecting a row of pixels via the row selection bus;
- (n) selecting a column of pixels via the column selection bus to select an individual pixel;
- (o) reading an output voltage values of the selected pixel;
- (p) storing the output voltage value in a memory;
- (q) selecting another column;
- (r) repeating steps (m)-(q) until substantially all of the pixels in the selected row have achieved substantially the same gain;
- (s) selecting another row; and
- (t) repeating steps (m)-(s) until substantially all of the pixels in the plurality of pixels have achieved substantially the same gain.

10. The method of claim 2, wherein multiple DC values representing gains needed to produce a flat field image corresponding to different temperatures are stored in a memory for each of the pixels in the array of pixels.

11. The method of claim 2, wherein multiple DC values representing a plurality of gains needed to produce flat field images are stored in a memory for each of the pixels.

12. The method of claim 1, wherein the plurality of pixels operates in one of imaging array snapshot mode and progressive scan mode.

13. An apparatus for equalizing gain in an array of electron multiplication (EM) pixels, comprising:
- a first array of EM pixels, each pixel comprising a phase 1 clocked gate, an EM clocked gate, and two DC gates formed between the phase 1 clocked gate and the EM clocked gate with implants to ensure charge transfer directionality;
- a processor and a memory configured to:
  - (a) apply initial voltages to the DC gates and an EM clocked gates of at least two pixels of a plurality of pixels;
  - (b) clock phase 1 clock gates and an EM clock gates associated with the at least two pixels of the plurality of pixels a predetermined number of times to achieve a pixel intensity value after impact ionization gain; and
  - (c) selectively adjust the difference in voltage between a DC gate and corresponding EM clocked gate of at least one pixel of the plurality of pixels until the difference between the resulting pixel intensity value and the average pixel intensity value needed to produce a desired image is below a predetermined threshold.

14. The apparatus of claim 13, wherein the processor and the memory are further configured to, before step (b), expose the plurality of pixels to light reflected from a flat field, wherein step (c) further comprises the steps of:
- (d) selectively adjust voltages applied to the DC gates associated with the at least two pixels of the plurality of pixels such that substantially all of the plurality of pixels are projected to have the same gain; and
- (e) repeat steps (b) and (d) until the difference between the resulting pixel intensity value and the average pixel intensity value needed to produce a desired flat field image is below a predetermined threshold.

15. The apparatus of claim 14, wherein the array of EM pixels is arranged in 2-dimensions array of rows and columns, each row including a common phase 1 clock gate bus and a common EM clock gate bus, each column including a common DC gate bus, and wherein the processor is further configured in (b) to:
- (f) select a row of pixels;
- (g) apply a first set of DC column voltages to the DC gate buses;
- (h) clock a phase 1 clock gate bus and an EM clock gate bus associated with the row of pixels; and
- (i) hold the phase 1 clock gate buses and EM clock gate buses of the other rows of pixels at predetermined constant DC voltages so as to be inactive.

16. The apparatus of claim 15, wherein the processor is further configured in (h) to:
- apply a first voltage to the phase 1 clock gate bus of the selected row of pixels, whereby first charge wells form below each of the phase 1 clock gates of the pixels associated with the selected phase 1 clock gate bus;
- apply a second voltage greater than the first voltage to the EM clock gate bus of the selected row of pixels, whereby second charge wells that are deeper than the first charge wells are formed below each of the EM: clock gates of the pixels associated with the selected EM clock gate bus, the first set of DC voltages less than the first and second voltages having been applied to the DC gate buses such that charge barriers form between the first charge wells and the second charge wells;
- integrate the first voltage, the second voltage and first set of DC voltages for a predetermined amount of time such that charge packets form in each of the first charge wells; and
- apply a third voltage that is less than each voltage in the first set of DC voltages to the phase 1 clock gate bus of the selected row of pixels, whereby each of the charge packets undergoes impact ionization as it transfers from a corresponding one of the first charge wells to a corresponding one of the second charge wells associated with each of the selected row of pixels.

17. The apparatus of claim 16, wherein the processor is further configured in (b) to:
- (j) select an additional row of pixels;
- (k) apply a second set of DC column voltages to each of the DC gate buses;
- (l) clock a phase 1 clock gate bus and an EM clock gate bus associated with the another row of pixels;
- (m) hold the phase 1 clock gate buses and EM clock gate buses of the other rows of pixels at predetermined constant DC voltages so as to be inactive; and
- (n) repeating (j)-(m) until substantially all rows in the plurality of pixels achieved an average pixel intensity value.

18. The apparatus of claim 17, wherein each row is associated with a row selection bus, wherein the processor is further configured in (c) to:
- (o) select a row of pixels via the row selection bus;

(p) read a set of output voltage values of each of the columns;
(q) store the set of output voltage values in the memory;
(r) select another row of pixels; and
(s) repeat (o)-(r) until substantially all of the rows in the plurality of pixels have achieved substantially the same gain.

19. The apparatus of claim 18, wherein the processor is further configured to:
recall substantially all of the stored voltage values;
perform a calculation to determine whether a flat field image has been achieved;
calculate a plurality of DC voltages to be applied to corresponding ones of the DC gates in the plurality of pixels to achieve the same gain; and
store values corresponding to the plurality of DC voltages in the memory.

20. The apparatus of claim 15, wherein the plurality of EM pixels is arranged in 2-dimensions array of rows and columns, each row including a common phase 1 clock gate bus and a common EM clock gate bus, each column including a common DC gate bus, and wherein the processor is further configured in (b) to:
(f) select a row of pixels;
(g) select DC gate bus voltages (one per column per selected row);
(h) apply DC column voltages to the DC gate column buses;
(i) clock a phase 1 clock gate bus and an EM clock gate bus associated with the row of pixels;
(j) hold the phase 1 clock gate buses and EM clock gate buses of the other rows of pixels at predetermined constant DC voltages so as to be inactive;
(k) select another DC gate bus; and
(l) repeat (h)-(k) until substantially all of the pixels in the plurality of pixels have achieved the average pixel intensity value.

21. The apparatus of claim 20, wherein each row is associated with a row selection bus, wherein each column is associated with a column selection bus, and the processor is further configured in (b) to:
(m) select a row of pixels via the row selection bus;
(n) select a column of pixels via the column selection bus to select an individual pixel;
(o) read an output voltage values of the selected pixel;
(p) store the output voltage value in the memory;
(q) select another column;
(r) repeat (o)-(q) until substantially all of the pixels in the selected row have achieved substantially the same gain;
(s) select another row; and
(t) repeat (n)-(s) until substantially all of the pixels in the plurality of pixels have achieved substantially the same gain.

22. The apparatus of claim 14, wherein multiple DC values representing gains needed to produce a flat field image corresponding to different temperatures are stored in the memory for each of the pixels in the array of pixels.

23. The apparatus of claim 14, wherein multiple DC values representing a plurality of gains needed to produce flat field images are stored in the memory for each of the plurality of pixels.

24. The apparatus of claim 13, wherein the plurality of pixels operates in one of imaging array snapshot mode and progressive scan mode.

\* \* \* \* \*